US008350157B2

(12) United States Patent
Lai et al.

(10) Patent No.: US 8,350,157 B2
(45) Date of Patent: Jan. 8, 2013

(54) PRINTED CIRCUIT BOARD

(75) Inventors: Ying-Tso Lai, Taipei Hsien (TW);
Yu-Chang Pai, Taipei Hsien (TW)

(73) Assignee: Hon Hai Precision Industry Co., Ltd.,
New Taipei (TW)

( * ) Notice: Subject to any disclaimer, the term of this patent is extended or adjusted under 35 U.S.C. 154(b) by 254 days.

(21) Appl. No.: 12/870,999

(22) Filed: Aug. 30, 2010

(65) Prior Publication Data

US 2012/0018199 A1  Jan. 26, 2012

(30) Foreign Application Priority Data

Jul. 23, 2010 (TW) .............................. 99124454 A

(51) Int. Cl.
*H05K 1/00* (2006.01)
*H05K 1/09* (2006.01)

(52) U.S. Cl. ........................................ 174/252; 174/257

(58) Field of Classification Search ........................ None
See application file for complete search history.

(56) References Cited

U.S. PATENT DOCUMENTS

| 5,451,720 | A | * | 9/1995 | Estes et al. ..................... 174/250 |
| 5,473,813 | A | * | 12/1995 | Chobot et al. ................... 29/837 |
| 5,590,030 | A | * | 12/1996 | Kametani et al. ............. 361/794 |
| 6,235,994 | B1 | * | 5/2001 | Chamberlin et al. ......... 174/252 |
| 6,521,842 | B2 | * | 2/2003 | Brinthaupt et al. ........... 174/252 |
| 6,710,258 | B2 | * | 3/2004 | Oggioni et al. ................ 174/255 |
| 2009/0183899 | A1 | * | 7/2009 | Ishida .......................... 174/252 |
| 2011/0094787 | A1 | * | 4/2011 | Lai et al. ....................... 174/262 |

\* cited by examiner

*Primary Examiner* — Gregory Thompson
(74) *Attorney, Agent, or Firm* — Altis Law Group, Inc.

(57) ABSTRACT

A printed circuit board includes a layer. A layer of copper is covered on a surface of the layer. A through hole passes through the printed circuit board. An approximately C-shaped thermal engraving is defined in the surface of the layers, surrounding the through hole and without being covered by the layer of copper. An opening of the thermal engraving faces an output terminal of the power supply.

3 Claims, 2 Drawing Sheets

PRINTED CIRCUIT BOARD

BACKGROUND

1. Technical Field

The present disclosure relates to a printed circuit board (PCB) and a manufacturing method of the PCB.

2. Description of Related Art

A PCB usually includes a reference layer, which includes copper and a through hole. A component is mounted on the PCB by inserting a pin through the through hole in the PCB and then soldering the pin in place on an opposite side of the PCB during a reflow process. The pin of the component is electrically connected to the reference layer. The reference layer of the printed circuit board distributes heat quickly due to a large surface area of the copper. However, rapid heat dissipation may lead to distortion of the PCB during the soldering process. Therefore there is room for improvement in the art.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
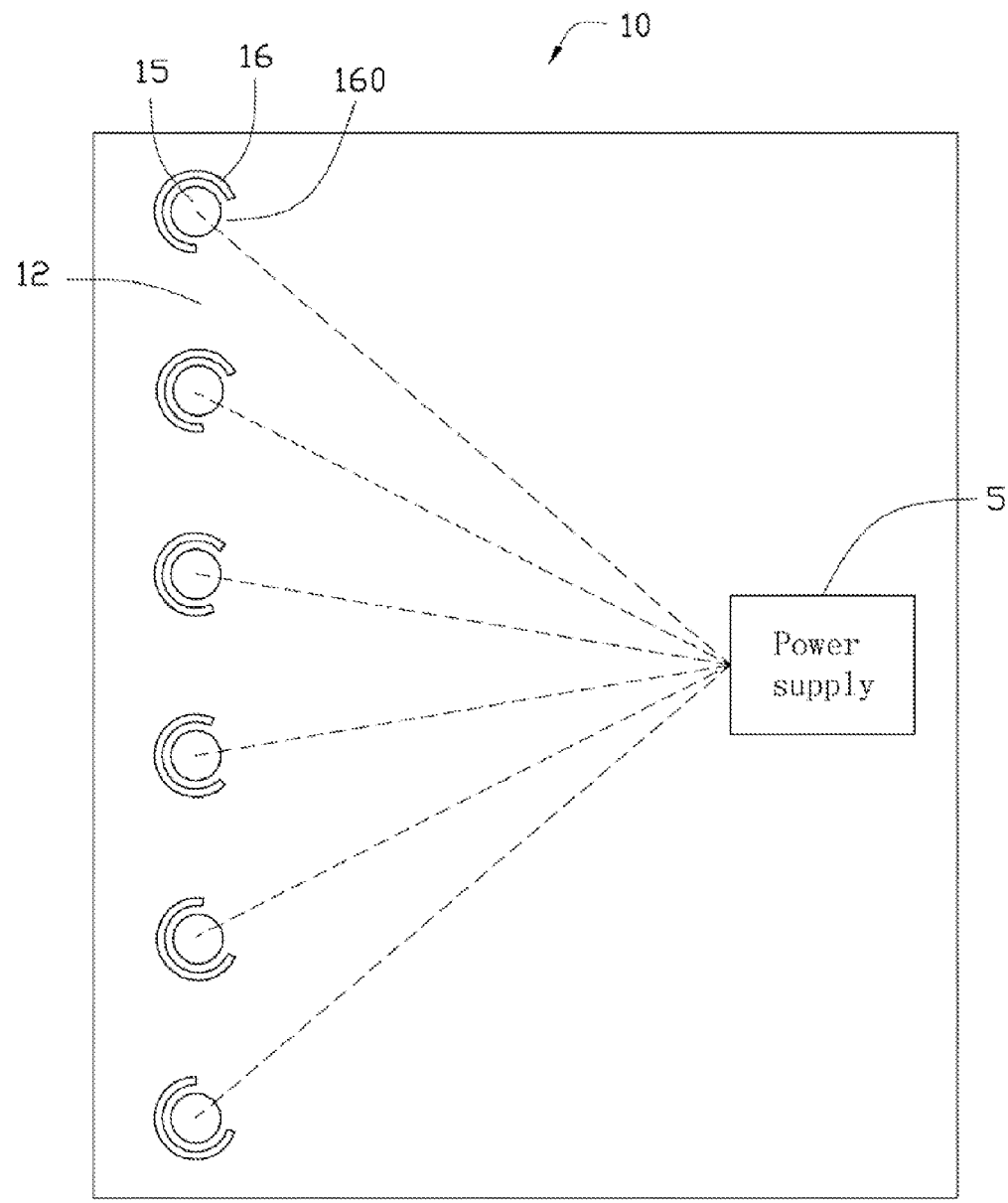
FIG. 1 is a schematic diagram of an exemplary embodiment of a printed circuit board, the printed circuit board defines a through hole.

Referring to FIG. 1, an exemplary embodiment of a printed circuit board (PCB) includes a power supply 5, a power layer 10 and other layers (not shown), such as a ground layer and signal layers. The PCB defines a through hole 15 through the power layer 10 and the other layers. A layer of copper 12 is arranged on a surface of the power layer 10. The power layer 10 defines a thermal engraving 16.

A component (not shown) may be mounted on the PCB by inserting a pin of the component through the through hole 15 and then soldering the pin in place on an opposite side of the PCB. The pin of the component is electrically connected to the power layer 10 and other layers, to transmit signals between layers of the PCB and the component.

The thermal engraving 16 is a substantially C-shaped groove which is defined in the surface of the power layer 10 and arranged surrounding the through hole 15. The layer of copper 12 does not cover the thermal engraving 16. An opening 160 of the C-shaped thermal engraving 16 opposes an output terminal of the power supply 5. In the embodiment, a depth of the C-shaped thermal engraving 16 is greater than or equal to a thickness of the layer of copper 12. A length of the opening 160 of the thermal engraving 16 is one third of a length of the C-shaped groove.

As a result, when the pin of the component is inserted through the through hole 15, heat dissipation is slower because there is relatively less copper in the area of the through hole 15 due to the existence of the thermal engraving 16. Moreover, because of the opening 160 of the thermal engraving 16 is directed to the output terminal of the power supply 5, a distance between the pin of the component inserted in the through hole 15 and the output terminal of the power supply 5 has been shortened. As a result, an equivalent resistance between the pin of the component inserted in the through hole 15 and the output terminal of the power supply 5 is reduced.

Figure 2:
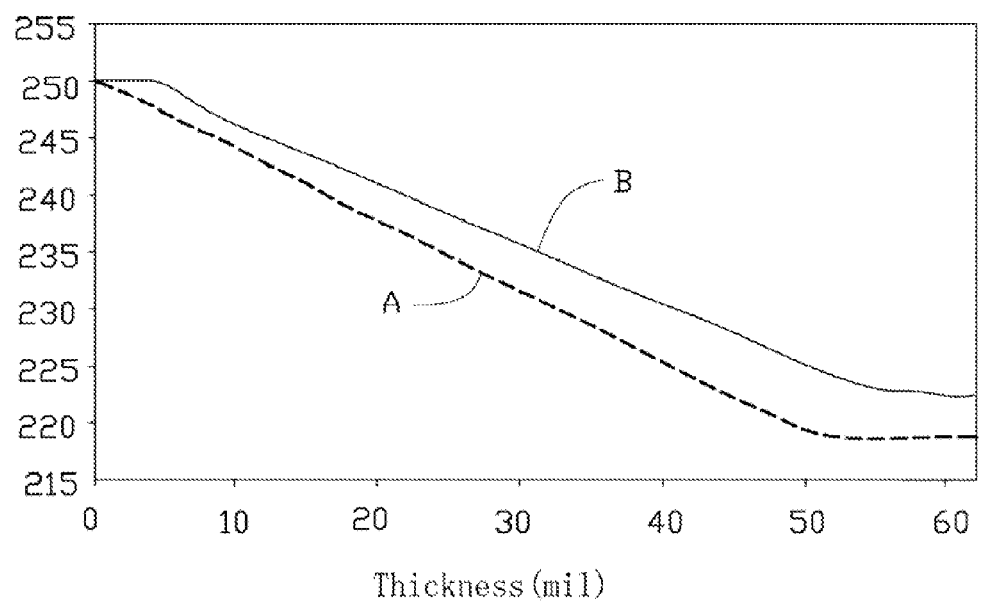
FIG. 2 is a graph of the temperature in the through hole of the printed circuit board of FIG. 1.

Referring to FIG. 2, a curve A denotes the temperature in a through hole of a conventional PCB, and a curve B denotes the temperature in the through hole 15 of the PCB at various thicknesses of the ground layer measured during a soldering process. Clearly the temperature in the through hole 15 of the PCB is higher than in the through hole of the conventional PCB during soldering, and the thicker the ground layer the greater the difference in temperature. The higher temperature is indicative of the slower heat dissipation in the area of the through hole 15 during soldering meaning fault formation is decreased or even eliminated.

In other embodiments, the thermal engraving 16 may be arranged in another layer, such as a ground layer of the PCB. In addition, a shape of the groove of the thermal engraving 16 may be changed.

The foregoing description of the exemplary embodiments of the disclosure has been presented only for the purposes of illustration and description and is not intended to be exhaustive or to limit the disclosure to the precise forms disclosed. Many modifications and variations are possible in light of the above everything. The embodiments were chosen and described in order to explain the principles of the disclosure and their practical application so as to enable others of ordinary skill in the art to utilize the disclosure and various embodiments and with various modifications as are suited to the particular use contemplated. Alternative embodiments will become apparent to those of ordinary skills in the art to which the present disclosure pertains without departing from its spirit and scope. Accordingly, the scope of the present disclosure is defined by the appended claims rather than the foregoing description and the exemplary embodiments described therein.

What is claimed is:

1. A printed circuit board comprising a layer and a power supply, the layer comprising:
   a layer of copper arranged on a surface of the layer;
   wherein a through hole passes through the printed circuit board; and
   wherein a C-shaped thermal engraving is defined in the surface of the layer and substantially surrounds the through hole, the C-shaped thermal engraving is not covered with the layer of copper, and an opening of the thermal engraving faces an output terminal of the power supply.

2. The printed circuit board of claim 1, wherein a depth of the thermal engraving is greater than or equal to a thickness of the layer of copper.

3. The printed circuit board of claim 1, wherein the layer is a power layer.

* * * * *